United States Patent
Kahn et al.

(10) Patent No.: US 6,191,523 B1
(45) Date of Patent: *Feb. 20, 2001

(54) TRANDUCING COMPOSITE OF SINTERED PIEZOELECTRIC CERAMIC GRANULES IN A POLYMER MATRIX

(75) Inventors: Manfred Kahn, Alexandria, VA (US); Mark Chase, Laurel, MD (US)

(73) Assignee: The United States of America as represented by the Secretary of the Navy, Washington, DC (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/903,359

(22) Filed: Jul. 30, 1997

(51) Int. Cl.[7] .................................................. H01L 41/08
(52) U.S. Cl. ............................................ 310/358; 310/337
(58) Field of Search .................................. 310/357–359, 310/800, 334–337

(56) References Cited

U.S. PATENT DOCUMENTS

| | | | |
|---|---|---|---|
| 4,412,148 | 10/1983 | Klicker et al. | 310/358 |
| 5,142,187 | * 8/1992 | Saito et al. | 310/358 |
| 5,334,903 | * 8/1994 | Smith | 310/358 |
| 5,340,510 | 8/1994 | Bowen | 264/434 |
| 5,376,859 | 12/1994 | Kim et al. | 310/334 |
| 5,527,480 | 6/1996 | Bailey | 252/62.9 |

OTHER PUBLICATIONS

Safari A., et al, "Flexible Composite Transducers", J. Am. Ceram. Soc., 65: 207–209, 1982.

Harrison, W. B. et al, "Pyroelectric Properties of Flexible PZT Composites", Ferroelectrics, 1980, vol. 27, pp 125–128.

Harrison, W. B., "Flexible Piezoelectric Organic Composites" Proceedings of the Workshop on Sonar Transducer Materials, Naval Research Laboratories, Nov. 1975, p. 257.

* cited by examiner

*Primary Examiner*—Mark O. Budd
(74) *Attorney, Agent, or Firm*—John J. Karasek; Amy L. Ressing

(57) ABSTRACT

A piezoelectric ceramic-polymer composite is made of a substantially two-dimensional polymer matrix and a monolayer of sintered piezoelectric ceramic granules dispersed throughout the matrix so that each granule has an upper portion protruding from one side of the matrix and a lower portion protruding from the opposite side of the matrix. The composite is formed by partially embedding a monolayer of sintered piezoelectric ceramic granules in a pliable material, then partially covering the granules with a polymer resin, curing the resin to form a matrix and removing the pliable material. A transducer is formed by flattening the upper and lower portions of the granules to form coplanar top and bottom surfaces parallel to, but not coplanar with the surface of the matrix, then electroding the granule surfaces, attaching top and bottom cover plates, and sealing the transducer around the edges.

18 Claims, 2 Drawing Sheets

TRANDUCING COMPOSITE OF SINTERED PIEZOELECTRIC CERAMIC GRANULES IN A POLYMER MATRIX

BACKGROUND OF THE INVENTION

1. Field of the Invention

The invention relates generally to piezoelectric transducers and more particularly to ceramic granule-polymer composites for large area transduction and to methods of making such composite transducers.

2. Background of the Related Art

Piezoelectric transducers are devices that utilize a piezoelectric ceramic to convert mechanical energy into electrical energy or electrical energy into mechanical energy. Transducers have numerous practical applications including in hydrophones for detecting underwater acoustic waves.

An ongoing problem in developing hydrophones is finding piezoelectric material in which the desirable properties for underwater transducer applications are optimized. Ideally, the piezoelectric material should exhibit good hydrostatic response, should have a low weight and density, should be homogeneous and should be easy to manufacture in a large area configuration. Single-phase piezoelectrics, such as those made of single-phase lead zirconate titanate (PZT), a widely used piezoelectric material, are not well suited for use as monolytic large area hydrophones because of their weight, density, inflexibility and expense. Consequently, research on materials and structures for large area hydrophones has focused on developing composite configurations such as ceramic-polymer composites. In ceramic-polymer composites, a piezoelectrically active phase, typically a piezoelectric ceramic, is combined with a flexible, piezoelectrically inactive phase, typically an elastic polymer, that has desirable mechanical properties such as strength, low density and flexibility. The composite material is typically formed as a substantially two-dimensional sheet that is provided with relatively stiff top and bottom activation ("cover") plates.

In a two-phase system such as in a piezoelectric ceramic-polymer composite, the piezoelectric properties depend on the connectivity of the two phases. Connectivity of the phases of a composite is defined by the number of dimensions in which each phase is self-connected. Under a notation system described by Newnham et al, "Connectivity and Piezoelectric Composites",Mat. Res. Bull. Vol 13 (1978) pp 525–536, ten different types of connectivity are possible in a two-phase ceramic-polymer system: 0-0, 1-0, 2-0, 3-0, 1-1, 2-1, 3-1, 2-2, 3-2, and 3-3, with the first numeral referring to the self-connectedness of the ceramic and the second numeral referring to the self-connectedness of the polymer.

The simplest type of piezoelectric ceramic-polymer composite is a composite with 0-3 connectivity, that is, a composite that has discrete non-connected piezoelectric ceramic particles surrounded by a polymer matrix that is self-connected in three dimensions. Ceramic-polymer composites having 0—3 connectivity are described in U.S. Pat. No. 4,977,547 to Giniewicz et al, in W. B. Harrison et al, "Pyroelectric Properties of Flexible PZT Composites" Ferroelectrics, 1980, Vol. 27, pp 125–128, and in W. B. Harrison, "Flexible Piezoelectric Organic Composites", Proceedings of the Workshop on Sonar Transducer Material, Naval Research Laboratories, P.257, November 1975, all of the above incorporated herein by reference. Piezoelectric ceramic-polymer composites with 0–3 connectivity are relatively easy and inexpensive to make by the steps of mixing the ceramic particles with the polymer and then shaping and curing the mixture to form the composite. The disadvantage of 0–3 piezoelectric ceramics is that since the particles are generally disconnected from one another, the electrical and force field is always in part across piezoelectrically inactive material, and the overall piezoelectric activity is therefore less than that of the ceramic itself.

The overall piezoelectric response is improved in composites having 1–3 connectivity, that is, composites having a piezoelectric ceramic that is self-connected in one dimension (i.e., in the direction that force is applied), surrounded by a polymer phase that is self-connected in three dimensions. Typically, the ceramic phase is in the form of an array of ceramic rods aligned in the poling direction and held together by the polymer matrix. Cover plates may be disposed on opposing sides of the matrix transversely to the rods. Ceramic-polymer composites having 1–3 connectivity are described in U.S. Pat. No. 5,527,480 to Bailey et al, U.S. Pat. No. 4,412,148 to Klicker et al, and U.S. Pat. No. 5,340,510 to Bowen, all of the above incorporated herein by reference. A disadvantage of 1–3 composites is that they are more complex structures that can be difficult and labor intensive to fabricate on a large scale. A simpler method of fabricating composites with 1–3 connectivity by covering piezoelectric ceramic spheres with a polymer and then sanding the polymer to expose the ceramic spheres is described in Safari et al, "Flexible Composite Transducers", J. Am. Ceram. Soc., 65: 207–209, 1982.

The 1–3 composites described above typically have the disadvantage of an inefficient transfer of force from the cover plates to the ceramic rods, because some of the force is applied to the coplanar polymer matrix instead of to the ceramic rods. U.S. Pat. No. 5,376,859, incorporated herein by reference, describes a transducer having rods that extend beyond the matrix and cover plates that are disposed so that they touch only the rods and do not transmit force to the polymer matrix. However, the transducer described is a complex structure that is difficult and labor intensive to manufacture.

SUMMARY OF THE INVENTION

An object of the invention is to provide a transducer and method of making a transducer that has 1–3 connectivity yet is as easy to manufacture as a 0–3 composite.

Another object of the invention is to provide a transducer and method of making a transducer that has low weight.

Another object of the invention is to provide a transducer and method of making a transducer that can be cast easily as a wide composite sheet for large area devices.

Another object of the invention is to provide a transducer and method of making a transducer that has improved force transfer between the cover plates and the piezoelectric ceramic.

These and other objects of the invention are accomplished by providing a ceramic-polymer composite comprising a substantially two-dimensional polymer matrix having top and bottom opposing sides and a monolayer of sintered piezoelectric ceramic granules dispersed throughout the matrix. Each of the sintered piezoelectric ceramic granules of the monolayer has an upper portion protruding out of the top side of the polymer matrix and a lower portion protruding out of the bottom side of the polymer matrix. The upper portion of each ceramic granule has a flattened top surface. The top surfaces of the granules are substantially coplanar with one another and parallel to the plane of the polymer matrix. The lower portion of each ceramic granule has a flattened bottom surface and the bottom surfaces of the granules are substantially coplanar with one another and parallel to, but not coplanar with, the plane of the polymer matrix.

The transducer of the present invention comprises the ceramic-polymer composite as described above wherein each top and bottom surface of each ceramic granule has a layer of electrically conductive material thereon. A top cover plate contacts the layer of electrically conductive material on the top surfaces and a bottom cover plate contacts the layer of electrically conductive material on the bottom surfaces. A seal is disposed along the edges of the device between the top and bottom cover plates.

The method of making the ceramic-polymer composite of this invention includes the steps of partially embedding a monolayer of sintered piezoelectric ceramic granules in a layer of pliable material, partially covering the partially embedded sintered piezoelectric ceramic granules with a layer of curable polymer resin, so that each of the sintered piezoelectric ceramic granules has a lower portion embedded in the layer of pliable material, a middle portion contained within the layer of curable polymer resin and a upper portion protruding above the layer of curable polymer resin. The curable polymer resin is then cured to form the polymer matrix. The layer of pliable material is then removed to expose the lower portions of the sintered piezoelectric ceramic granules. The upper portions of the sintered piezoelectric ceramic granules are flattened to form ceramic top surfaces that are coplanar with one another and parallel to the plane of the polymer matrix. The lower portions of the sintered piezoelectric ceramic granules are also flattened to form ceramic bottom surfaces that are coplanar with one another and parallel to the plane of the polymer matrix. Both the coplanar top surfaces and the coplanar bottom surfaces are spaced away from from the top and bottom surfaces of the polymer matrix.

To make the transducer of the present invention, a layer of electrically conductive material is applied to the coplanar top surfaces and to the coplanar bottom surfaces of each sintered piezoelectric ceramic granule. Top and bottom cover plates are then applied to contact the layer of electrically conductive material on the coplanar top and bottom surfaces. The device is poled, and the edges of the device between the top and bottom cover plates are then sealed.

BRIEF DESCRIPTION OF THE DRAWINGS

FIGS. 1(a–e) are schematic cross-sections showing steps in the method of making the transducing composite.

DETAILED DESCRIPTION OF THE PREFERRED EMBODIMENTS

Figure 1A:
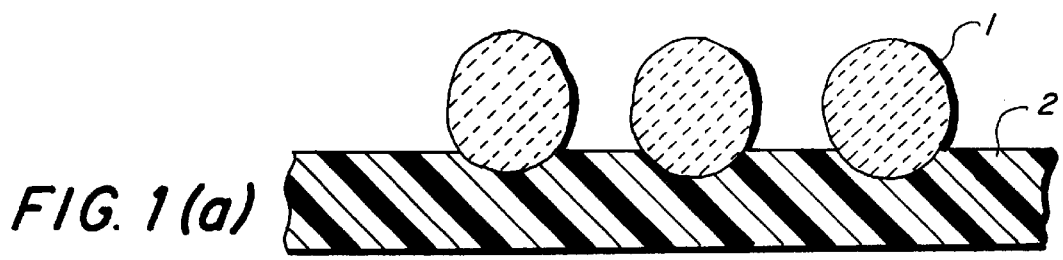
FIG. 1(a) shows the ceramic granules partially embedded in a pliable material.
Figure 1B:
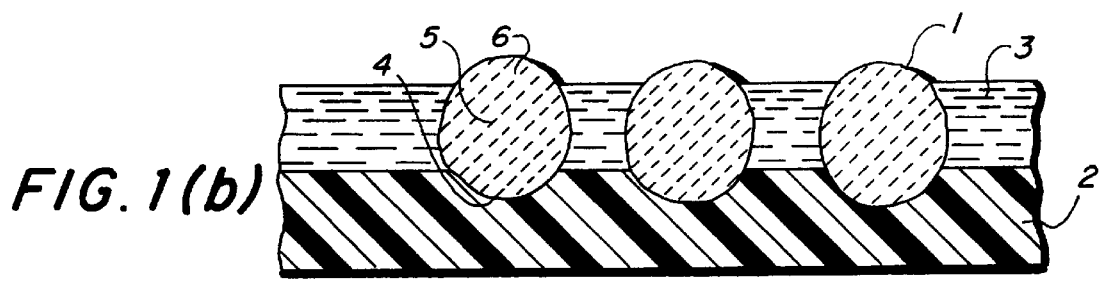
FIG. 1(b) shows the ceramic granules partially embedded in a pliable material and partially embedded in a layer of curable polymer resin.
Figure 1C:
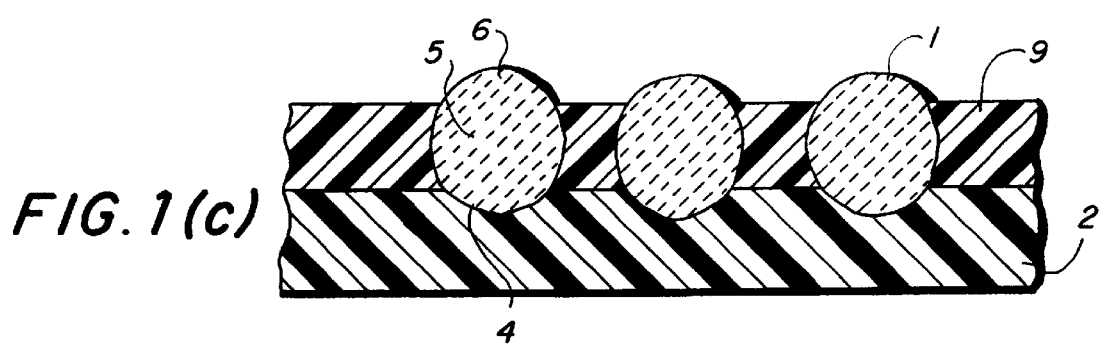
FIG. 1(c) shows the ceramic granules embedded in the pliable material and partially embedded in the cured polymer matrix.
Figure 1D:
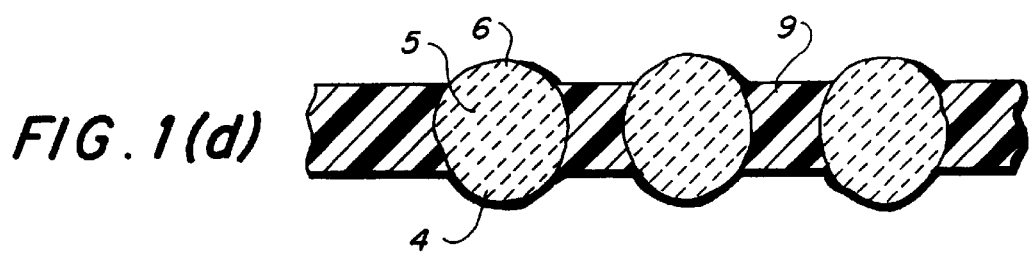
FIG. 1(d) shows the ceramic granules in the polymer matrix after the pliable material has been removed.

The transducing composite of the present invention comprises a monolayer of sintered granules of piezoelectric ceramic embedded in and dispersed throughout a polymer matrix. The piezoelectric granules used in the present invention are preferably fully sintered, polycrystalline, piezoelectric ceramic granules having a diameter of about 1 to about 25 mm. The granules can be any shape including spherical or cylindrical or polygonal. The granules are prepared by creating a dough containing micron sized piezoelectric ceramic powder and a binder and forming the dough into precursor granules about 20% larger than the desired size of the sintered granules. The precursor granules may be formed by rolling the dough on a screen or between two flat surfaces or by pressing pellets into cylindrical or polygonal shapes. The latter can be abraded by, for example, low intensity milling to obtain more rounded shapes in order to make automated transducer assembly easier. The precursor granules are then sintered to a density above 93% of the theoretical density, whereupon they shrink about 20% in diameter. Preferably, the granules in a particular transducer are all about the same size and shape. It is particularly desirable that the granules have about the same height, that is, the same dimension perpendicular to the plane of the polymer matrix, though slight differences in height can be corrected in the flattening process described below.

Any piezoelectric ceramic composition may be used. Preferably the piezoelectric ceramic is PZT-5H (a doped lead-zirconate-titanate).

The polymer matrix is any organic material that has adequate mechanical strength, compressibility and flexibilty so that it can hold the ceramic granules and reduce the lateral effects of hydrostatic pressure fluctuations exerted on the transducer without cracking or breaking. The polymer matrix is preferably a cured polymer that is made from a curable polymer resin. Preferably, the polymer matrix is epoxy or polyurethane. The polymer matrix is substantially two-dimensional or planar, meaning that the length and width of the matrix are much greater than its thickness and has top and bottom opposing sides. The thickness of the polymer matrix is less than the thickness of the granules, and the granules are embedded in the matrix so that each granule has a upper portion protruding out of the top side of the matrix and a lower portion protruding out of the bottom side of the matrix.

The spacing and distribution of the ceramic granules in the matrix depends on the intended use of the composite. The spacing and distribution, also called the "ceramic loading", may be defined in terms of the areal ratio or percentage, that is, the ratio or percentage of the cross-sectional area occupied by the ceramic granules to the total area of the matrix as viewed from an axis perpendicular to the plane of the matrix. If the composite is to be used as a passive receiver, the ceramic loading is typically in the range of about 10% to about 30%. If the composite is to be used as a transceiver, the ceramic loading is typically in the range of about 25% to about 35%. If the composite is to be used as a projector for high power sound generation, the ceramic loading is typically above 50%.

The transducing composite may be made by a series of steps as shown schematically in FIGS. 1(a–e). Sintered piezoelectric ceramic granules are dispersed across and partially embedded in a pliable material to form a monolayer wherein the ceramic granules have the same spacing and distribution as is desired for the finished composite. FIG. 1(a) schematically shows the monolayer of sintered piezoelectric ceramic granules 1 partially embedded in a pliable material 2. The pliable material can be any material that can serve to cover the lower portion of the granules during the formation of the polymer matrix and that is easily removable after the polymer matrix is formed. Preferably, the pliable material is partially cured cement. Other suitable materials include porous silicon rubber, paraffin or other low melting waxes. Next, as shown schematically in FIG. 1(b), the partially embedded ceramic granules are partially covered with a layer of fluid, curable polymer resin 3 so that each of the ceramic granules 1 has a lower portion 4 embedded in the layer of pliable material 2, a middle portion 5 embedded in the polymer resin 3 and an upper portion 6 protruding above the polymer resin. Preferably, this step of the process is carried out in a frame or other form of enclosure so that the fluid, curable polymer resin is kept contained and does not run out. The polymer resin is then cured to form a solid polymer matrix 9 as shown in FIG. 1 (c). The pliable material is then removed by any known means to expose the lower portions 4 of the ceramic granules. For example, if the pliable material is partially cured cement, the pliable material may be removed by dissolving it in acetone. As shown in FIG. 1(d), the resulting structure is a monolayer of ceramic granules 1 each having a upper portion 6 and a lower portion 4 protruding from the polymer matrix 9. Except during the manufacturing process as described above, the upper and lower sides (top and bottom) of the composite structure are interchangeable. References made herein in the description of the composite and the transducer of the present invention to "upper" and "lower" portions, "top" and "bottom" surfaces or "top" and "bottom" cover plates are made only for convenience.

Figure 1E:
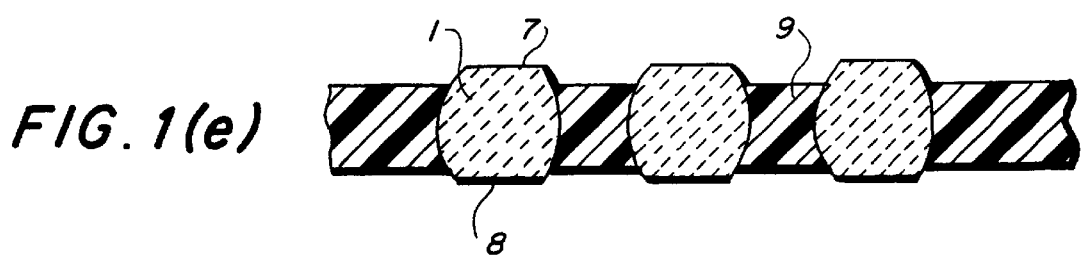
FIG. 1(e) shows the transducing composite after the top and bottom surfaces of the ceramic granules have been ground.

The upper and lower portions of the ceramic granules are flattened by any known method such as by grinding to produce the transducing composite 11 as shown in FIG. 1(e) wherein each granule has top and bottom flat surfaces 7 and 8 and wherein the top surfaces 7 and the bottom surfaces 8 are substantially coplanar and parallel to, but spaced away from, the plane of the polymer matrix 9. Preferably, the top and bottom surfaces are ground so that the upper and bottom portions of the granule protrude about 0.1 to about 1.0 mm from the surface of the polymer matrix 9.

An alternative method to make the composite is to completely embed the granules in a hard but soluble matrix such as a wax or a methacrylate and then dissolve a top and bottom portion of the matrix to create a composite having granules partially embedded in the matrix and having upper portions and lower portions protruding from the matrix. The top and bottom surfaces of the granules can be flattened by grinding before or after the solvent treatment.

To make the transducer of the present invention, the ceramic granules are electroded by applying a layer of electrically conductive material such as plated, sputtered or gold coated nickel, commercial silver paint or silver-filled epoxy to the top and bottom flat surfaces of the ceramic granules. Top and bottom cover plates are then applied. The cover plates serve to either transmit or to receive acoustical or electrical signals from or to the ceramic granules. The top cover plate contacts and interconnects the top electroded surfaces of the ceramic granules; the bottom cover plate contacts and interconnects the bottom electroded surfaces of the ceramic granules. The cover plates can be made of an electrically conducting metal or a non-conducting material coated with an electrically conducting coating, such as a thin copper coating or cladding applied by vapor deposition or by lamination. If a conductive epoxy such as silver-filled epoxy is used as the electrically conductive material for electroding the top and bottom flat surfaces of the ceramic granules, the need for absolute flatness and parallelism in the surfaces of the ground granules is reduced. The epoxy can be applied in a layer that is uncured and compressed when the cover plated are applied, so that any deviations in flatness and parallelism are compensated for. The conductive epoxy can then be cured after the cover plates are put in place. Because the cover plates contact only the electroded ceramic granules, all the force exerted on the cover plates from the environment is transmitted directly to the ceramic granules.

The transducer can be electrically poled by any conventional means, such as by exposing it to temperatures near 100° C. with an applied voltage of 2–3 kV per millimeter of ceramic thickness.

Figure 2:
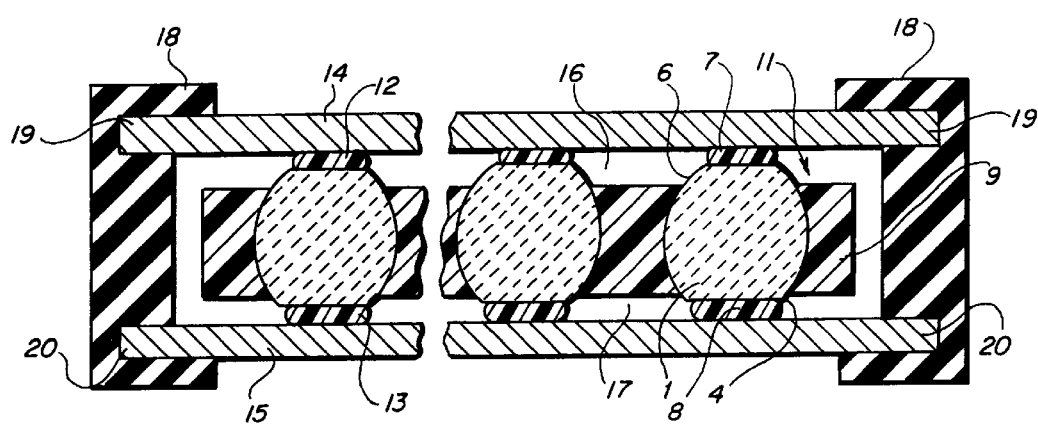
FIG. 2 is a schematic cross-section of the preferred piezoelectric transducer, including the cover plates, of the present invention.

As illustrated in the specific embodiment shown schematically in FIG. 2, the resulting transducer comprises the transducing composite 11, as described above, having a monolayer of ceramic granules 1 each having a upper portion 6 and a lower portion 4 protruding from the resin matrix 9, wherein each granule has top and bottom flat surfaces 7 and 8, wherein the top surfaces 7 and the bottom surfaces 8 are each substantially coplanar and are parallel to but offset from the plane of the matrix 9. Each granule has a layers 12 and 13 of electrically conducting material on the top and bottom surfaces 7 and 9. Top and bottom cover plates 14 and 15 are disposed coplanarly with the plane of the matrix so that the top cover plate 14 contacts the layer 12 of electrically conducting material on the top flat surface 7 and the bottom cover plate 15 contacts the layer 13 of electrically conducting material on the bottom flat surface 8. Because the ceramic granules extend beyond the plane of the resin matrix on both sides, the cover plates do not contact the resin matrix and air gaps 16 and 17 are left between the resin matrix and the cover plates 14 and 15. A seal 18 is then placed along the edges 19 and 20 between the top and bottom cover plates so that the interior of the transducing composite is isolated from the environment outside the transducer. The entire transducer as a whole may be coated on its outside with, or encased in, a suitable impedance-matching epoxy. This can provide insulation, waterproofing and protection.

Having described the invention, the following examples are given to illustrate specific applications of the invention, including the best mode now known to perform the invention. These specfic examples are not intended to limit the scope of the invention described in this application.

EXAMPLES

Example 1

A prototype transducer was constructed in the following manner:

A layer of DUCO cement was poured into a cylindrical frame having a inner diameter of 4.4 cm and was allowed to partially cure. A monolayer of sintered PZT-5H piezoelectric granules having a spherical shape, a density of 5.8 g/cc and a diameter of about 6.0 mm, made by forming and sintering PZT 5H powder, were spread across the layer of partially cured cement so that the areal ratio (ceramic loading) was about 35%. The granules were pressed into the cement so that about 2 mm of each granule was embedded in the partially cured cement. A layer of potting (Buehler Epo-Quick) epoxy resin was poured over the granules to cover all but the top 2 mm of the granules. The epoxy was cured overnight at 70° C. The epoxy and cement-embedded granules were removed from the frame and the partially cured cement was removed by dissolving it in acetone. The resulting composite comprised ceramic granules embedded in an epoxy matrix wherein about 2 mm of each granule protruded from the matrix on each side. The granules were then flattened by mounting the composite on a surface grinder and using a grinding wheel to grind the exposed portions of the granules so that the granules had top and bottom coplanar surfaces, each surface being spaced at a distance of about 1 mm from the top or bottom surface of the matrix. The granules were electroded by applying a layer of brushed-on air dry silver paint (Degussa #200) to the top and bottom surfaces. Cover plates of 3 mm thick copper plated phenolic were attached to the top and bottom of the composite so that the top cover plate contacted all the coplanar top surfaces of the granules and the bottom cover plate contacted all the coplanar bottom surfaces of the granules. The space between the top and bottom cover plates along the perimeter was sealed with a rubber seal by applying "RHO- C" flexible epoxy with a spatula to seal the edge gap between the plates so that the interior of the device was sealed off from the external environment. The device was electrically poled by applying 2.4 kV per mm of ceramic thickness at 70° C. for 10 minutes and external leads were attached to the top and bottom cover plates. The $d_{33}$ response of the device was measured using a Berlincourt $d_{33}$ meter and was found to be 144 pC/N.

Example 2

Additional prototypes were constructed as follows:

A layer of DUCO cement was poured into a square frame having a inner dimensions of 4×4 inches and was allowed to partially cure. A monolayer of sintered PZT-5H piezoelectric granules having a cylindrical shape, a density of 7.6 g/cc and a diameter of about 12.5 mm, made by forming and sintering PZT 5H powder, were spread across the layer of partially cured cement so that the areal ratio (ceramic loading) was about 35% and the distance between adjacent granules was about 28 mm. The granules were pressed into the cement so that about 4 mm of each granule was embedded in the partially cured cement. A layer of potting (Buehler Epo-Quick) epoxy resin was poured over the granules to cover all but the top 4 mm of the granules. The epoxy was cured by holding at 70° C. overnight. The epoxy and cement-embedded granules were removed from the frame and the partially cured cement was removed by dissolving it in acetone. The resulting composite comprised ceramic granules embedded in an epoxy matrix wherein about 4 mm of each granule protruded from the matrix on each side. The granules were then flattened by mounting the composite on a surface grinder and using a grinding wheel to grind the exposed portions of the granules so that the granules had top and bottom coplanar surfaces, each surface being spaced at a distance of about 1 mm from the top or bottom surface of the matrix. The granules were electroded by applying a layer of brushed-on air dry silver paint (Degussa #200) to the top and bottom surfaces. Cover plates of 3 mm thick copper plated phenolic were attached to the top and bottom of the composite so that the top cover plate contacted all the coplanar top surfaces of the granules and the bottom cover plate contacted all the coplanar bottom surfaces of the granules. The space between the top and bottom cover plates along the perimeter was sealed with a rubber seal by applying "RHO-C" flexible epoxy with a spatula to seal the edge gap between the plates so that the interior of the device was sealed off from the external environment. The device was electrically poled by applying 2.4 kV per mm of ceramic thickness at 70° C. for 10 minutes and external leads were attached to the top and bottom cover plates. The $d_{33}$ response of the device was measured using a Berlincourt $d_{33}$ meter and was found to be about 600 pC/N.

Example 3

A transducer was make according to the process described in example 2 except that the ceramic loading was 17.5%. The $d_{33}$ response of this device was found to be about 600 pC/N.

Obviously, many modifications and variations of the present invention are possible in light of the above teachings. It is therefore to be understood that, within the scope of the appended claims, the invention may be practiced otherwise than as specifically described.

What is claimed is:

1. A piezoelectric ceramic-polymer composite comprising
   a substantially two-dimensional polymer matrix made of a homogenous material, the matrix having top and bottom opposing sides,
   a monolayer of sintered piezoelectric ceramic granules dispersed throughout the polymer matrix, each granule having an upper portion protruding out of the top side of the polymer matrix, a lower portion protruding out of the bottom side of the polymer matrix and a middle portion in contact with the matrix.

2. The piezoelectric ceramic-polymer composite of claim 1 wherein the upper portion of each ceramic granule of the monolayer has a flattened top surface and wherein the top surfaces of the granules are substantially coplanar with one another and parallel to the plane of the polymer matrix and wherein the lower portion of each ceramic granule of the monolayer has a flattened bottom surface and wherein the bottom surfaces of the granules are substantially coplanar with one another and parallel to the plane of the polymer matrix.

3. A transducer comprisisng
   a substantially two-dimensional polymer matrix made of a homogenous material, the matrix having top and bottom opposing sides,
   a monolayer of sintered piezoelectric ceramic granules dispersed the polymer matrix, each granule having an upper portion protruding out of the top side of the polymer matrix and a lower portion protruding out of the bottom side of the polymer matrix, wherein the upper portion of each ceramic granule of the monolayer has a flattened top surface and wherein the top surfaces of the granules are substantially coplanar with one another and parallel to the plane of the polymer matrix and wherein the lower portion of each ceramic granules of the monolayer has a flattened bottom surface and wherein the bottom surfaces of the granules are substantially coplanar with one another and parallel to the plane of the polymer matrix, and each top surface and bottom surface having a layer of electrically conductive material thereon, and wherein the middle portion of each granule is in contact with the matrix,
   a top cover plate contacting the layer of electrically conductive material on the top surfaces and a bottom cover plate contacting the layer of electrically conductive material on the bottom surfaces and
   a seal disposed between the edges of the top cover plate and the bottom cover plate.

4. The transducer of claim 3, wherein the polymer matrix comprises a cured epoxy resin.

5. The transducer of claim 3, wherein the polymer matrix comprises a cured polyurethane resin.

6. The transducer of claim 3, wherein the sintered piezoelectric ceramic granules have a diameter of greater than about 1 mm and less than about 25 mm.

7. The transducer of claim 3, wherein the sintered piezoelectric ceramic granules are made of PZT 5H.

8. The transducer of claim 3, wherein the electrically conductive material is silver paint.

9. The transducer of claim 3, wherein the electrically conductive material is silver-filled epoxy.

10. The piezoelectric ceramic-polymer composite of claim 1 made by a method comprising the steps of
    partially embedding a monolayer of sintered piezoelectric ceramic granules in a layer of pliable material,
    partially covering the partially embedded sintered piezoelectric ceramic granules with a layer of a fluid, curable polymer resin, so that each of the sintered piezoelectric ceramic granules has a lower portion embedded in the layer of pliable material, a middle portion embedded in the layer of curable polymer resin and an upper portion protruding above the layer of curable polymer resin,
    curing the fluid, curable polymer resin to form a solid polymer matrix, removing the layer of pliable material to expose the lower portions of the sintered piezoelectric ceramic granules, flattening the upper portions of the sintered piezoelectric ceramic granules to form top surfaces that are coplanar with one another and parallel to the plane of the polymer matrix and flattening the lower portions of the sintered piezoelectric ceramic granules to form bottom surfaces that are coplanar with one another and parallel to the plane of the polymer matrix.

11. A transducer made by a method comprising the steps of creating the piezoelectric ceramic-polymer composite of claim 1 by the method of claim 10;

applying a layer of electrically conductive material to the coplanar top surfaces and the coplanar bottom surfaces of each sintered piezoelectric ceramic granule, applying a top cover plate to contact the layer of electrically conductive material on the coplanar top surfaces and a bottom cover plate to contact the layer of electrically conductive material on the coplanar bottom surfaces, poling the sintered piezoelectric ceramic granules, and applying a seal between the top and bottom cover plates.

12. The transducer of claim 11, wherein the pliable material is a partially cured cement that is dissolvable in acetone and wherein the step of removing the layer of pliable material is carried out by dissolving the pliable material in acetone.

13. The transducer of claim 11, wherein the fluid, curable resin is an epoxy resin.

14. The transducer of claim 11, wherein the soft resin is polyurethane.

15. The transducer of claim 11, wherein the sintered piezoelectric ceramic granules have a diameter of greater than about 1 mm and less than about 25 mm.

16. The transducer of claim 11, wherein the sintered piezoelectric ceramic granules are made of PZT 5H.

17. The transducer of claim 11, wherein the electrically conductive material is silver paint.

18. The transducer of claim 11, wherein the electrically conductive material is silver-filled epoxy.

* * * * *